(12) United States Patent
Nagata

(10) Patent No.: US 11,435,377 B2
(45) Date of Patent: Sep. 6, 2022

(54) INERTIAL SENSOR, ELECTRONIC APPARATUS, AND VEHICLE

(71) Applicant: Seiko Epson Corporation, Toyko (JP)

(72) Inventor: Kazuyuki Nagata, Minowa (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 17/233,601

(22) Filed: Apr. 19, 2021

(65) Prior Publication Data

US 2021/0325425 A1    Oct. 21, 2021

(30) Foreign Application Priority Data

Apr. 20, 2020  (JP) .............................. JP2020-074593

(51) Int. Cl.
| | | |
|---|---|---|
| *G01P 15/125* | (2006.01) | |
| *G01P 15/18* | (2013.01) | |
| *G01P 15/08* | (2006.01) | |
| *G01P 21/00* | (2006.01) | |

(52) U.S. Cl.
CPC ........ *G01P 15/125* (2013.01); *G01P 15/0802* (2013.01); *G01P 15/18* (2013.01); *G01P 21/00* (2013.01); *G01P 2015/0865* (2013.01)

(58) Field of Classification Search
CPC . G01P 15/125; G01P 15/0802; G01P 15/0865
See application file for complete search history.

(56) References Cited

U.S. PATENT DOCUMENTS

| | | |
|---|---|---|
| 2005/0109109 A1 | 5/2005 | Eskridge et al. |
| 2019/0062149 A1 | 2/2019 | Tanaka |
| 2019/0063924 A1 | 2/2019 | Tanaka |
| 2019/0064201 A1 | 2/2019 | Tanaka |
| 2019/0064202 A1* | 2/2019 | Tanaka ............... G01C 19/5705 |

(Continued)

FOREIGN PATENT DOCUMENTS

| | | |
|---|---|---|
| JP | 2019-045167 A | 3/2019 |
| JP | 2019-045170 A | 3/2019 |
| JP | 2019-045171 A | 3/2019 |

(Continued)

*Primary Examiner* — Walter L Lindsay, Jr.
*Assistant Examiner* — Andrew V Do
(74) *Attorney, Agent, or Firm* — Harness, Dickey & Pierce, P.L.C.

(57) ABSTRACT

The inertial sensor includes a substrate, stationary electrodes provided to the substrate, an element section including a movable body which is displaceable with respect to the stationary electrodes, and which has electrodes in a first portion and a second portion opposed to the stationary electrodes, a protrusion which limits a displacement of the movable body, and which has a detection electrode in a portion opposed to the first portion of the movable body, a drive circuit for outputting a drive signal to the element section, a contact detection circuit for outputting a detection signal due to a contact between the electrode in the first portion of the movable body and the detection electrode of the protrusion, a self-diagnostic circuit for outputting a test signal to the element section when receiving the detection signal from the contact detection circuit, and a determination circuit for determining whether or not a level of a signal output by the element section in response to the test signal is out of a threshold value.

12 Claims, 12 Drawing Sheets

(56) References Cited

U.S. PATENT DOCUMENTS

| | | |
|---|---|---|
| 2019/0120872 A1 | 4/2019 | Geisberger |
| 2020/0309814 A1 | 10/2020 | Takizawa et al. |

FOREIGN PATENT DOCUMENTS

| | | |
|---|---|---|
| JP | 2019-045172 A | 3/2019 |
| JP | 2020-024098 A | 2/2020 |
| JP | 2020-159917 A | 10/2020 |

* cited by examiner

INERTIAL SENSOR, ELECTRONIC APPARATUS, AND VEHICLE

The present application is based on, and claims priority from JP Application Serial Number 2020-074593, filed Apr. 20, 2020, the disclosure of which is hereby incorporated by reference herein in its entirety.

BACKGROUND

1. Technical Field

The present disclosure relates to an inertial sensor, an electronic apparatus, and a vehicle.

2. Related Art

In recent years, there has been developed a physical quantity sensor equipped with an acceleration sensor element or an angular velocity sensor element manufactured using a silicon MEMS (Micro Electro-Mechanical System) technology.

For example, in JP-A-2019-45172 (Document 1), there is disclosed a physical quantity sensor which is configured in accordance with a locker lever principle, and which detects the acceleration based on a capacitance varying in accordance with the acceleration applied in a vertical direction. This physical quantity sensor has a first stationary electrode and a second stationary electrode disposed on a support substrate, and a movable body as a movable electrode symmetrically disposed about the centerline of a torsion beam formed of a silicon substrate, wherein one side of the movable body is disposed so as to be opposed to the first stationary electrode, and the other side thereof is disposed so as to be opposed to the second stationary electrode. Further, in order to prevent an end portion of the movable body from making contact with the support substrate, a protrusion protruding toward the movable body is provided to the support substrate. In other words, the protrusion limits the displacement of the movable body to prevent the contact between the movable body and the support substrate.

However, in the physical quantity sensor described in Document 1, there is a problem that there is no mechanism for judging the situation of the movable body despite there is a possibility that the movable body and the protrusion make contact with each other in order to limit the displacement of the movable body to thereby damage the movable body when excessive acceleration is applied.

SUMMARY

An inertial sensor includes a substrate, a stationary electrode provided to the substrate, an element section including a movable body which is displaceable with respect to the stationary electrode, and which has electrodes in a first portion and a second portion opposed to the stationary electrode, a protrusion which is configured to limit a displacement of the movable body, and which has a detection electrode in a portion opposed to the first portion of the movable body, a drive circuit configured to output a drive signal to the element section, a contact detection circuit configured to output a detection signal due to a contact between the electrode in the first portion of the movable body and the detection electrode of the protrusion, a self-diagnostic circuit configured to output a test signal to the element section when receiving the detection signal from the contact detection circuit, and a determination circuit configured to determine whether or not a level of a signal output by the element section in response to the test signal is out of a threshold value.

An inertial sensor includes a substrate, a stationary electrode provided to the substrate, a detection electrode provided to the substrate, an element section including a movable body which is displaceable with respect to the stationary electrode, and which has an electrode in a portion opposed to the stationary electrode, and a protrusion which is configured to limit a displacement of the movable body, and which has an electrode in a portion opposed to the detection electrode, a drive circuit configured to output a drive signal to the element section, a contact detection circuit configured to output a detection signal due to a contact between the electrode of the protrusion and the stationary electrode, a self-diagnostic circuit configured to output a test signal to the element section when receiving the detection signal from the contact detection circuit, and a determination circuit configured to determine whether or not a level of a signal output by the element section in response to the test signal is out of a threshold value.

An electronic apparatus is provided with the inertial sensor described above.

A vehicle is provided with the inertial sensor described above.

DESCRIPTION OF EXEMPLARY EMBODIMENTS

1. First Embodiment

Figure 1:
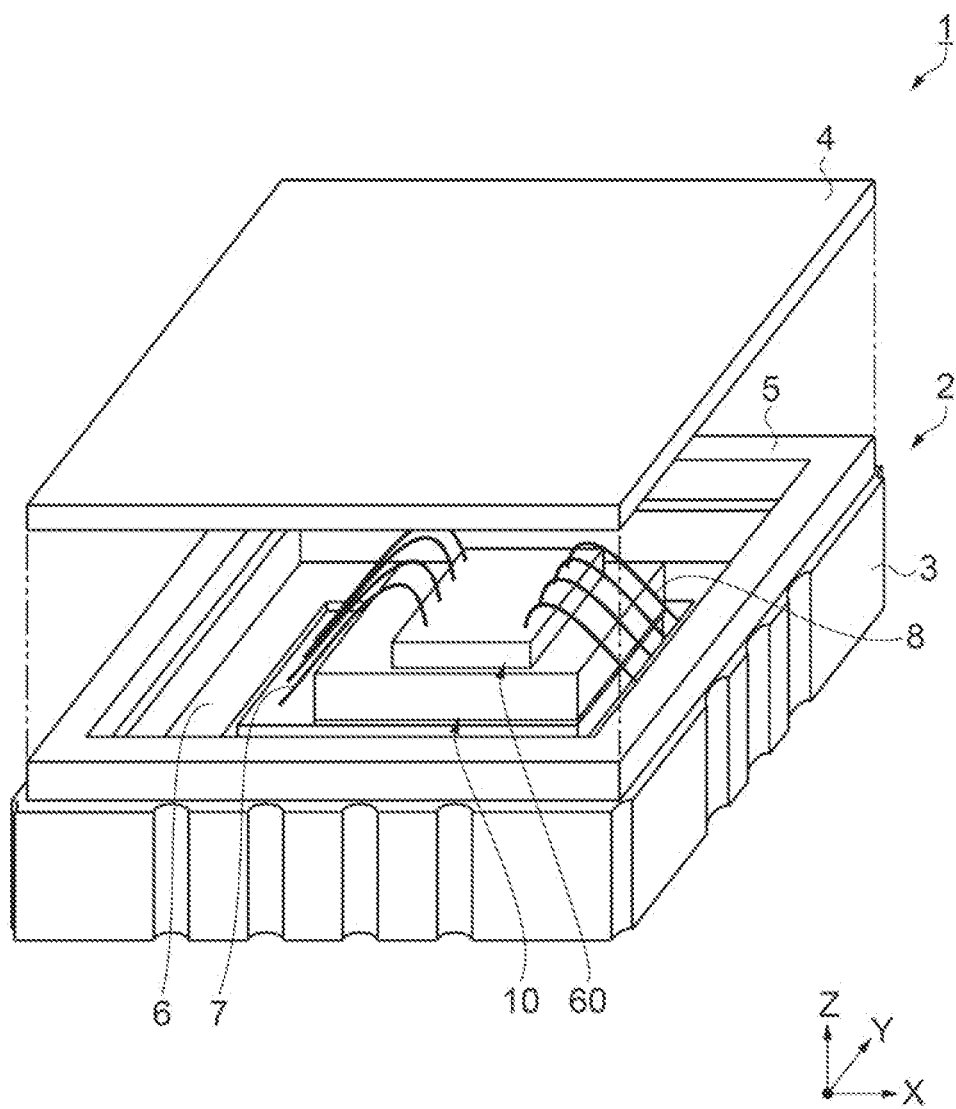
FIG. 1 is a schematic perspective view showing a configuration of an inertial sensor according to a first embodiment.

First, an inertial sensor 1 according to the first embodiment will be described with reference to FIG. 1 through FIG.

7. It should be noted that the illustration of a lid body 50 is omitted in FIG. 2 in order to make it easy to understand. Further, in FIG. 1 through FIG. 3, interconnections, terminals, and so on are omitted for the sake of convenience of explanation, and the dimensional ratios between the constituents are different from actual ones in order to make it easy to understand. Further, an X axis, a Y axis, and a Z axis in FIG. 1 through FIG. 3 and subsequent FIG. 8 through FIG. 12 are coordinate axes perpendicular to each other, wherein a direction along the X axis is defined as an "X direction," a direction along the Y axis is defined as a "Y direction," and a direction along the Z axis is defined as a "Z direction," and directions with arrows are positive directions. Further, the description will be presented assuming the positive direction in the Z direction as an "upper side" or "above," and the negative direction in the Z direction as a "lower side" or "below."

The inertial sensor 1 shown in FIG. 1 through FIG. 4 can be used as an acceleration sensor capable of detecting the acceleration in the Z axis, and is capable of detecting abnormality of the element. Such an inertial sensor 1 has a package 2, and an acceleration sensor element 10 and an IC (Integrated Circuit) 60 housed in the package 2.

The package 2 has a base part 3, a lid part 4, and a seal member 5 for bonding the base part 3 and the lid part 4 to each other. The base part 3 is provided with a recessed part 6 opening upward, and the seal member 5 is disposed above the base part 3.

In the recessed part 6, there are disposed the acceleration sensor element 10, and the IC 60 which is stacked on the acceleration sensor element 10, and which is bonded with an adhesive or the like, wherein the IC 60 is stacked on a surface the acceleration sensor element 10, and a surface of the acceleration sensor element 10 opposite to the surface on which the IC 60 is stacked is fixed by bonding to an inner bottom surface of the recessed part 6 via an adhesive or the like. Further, the inside of the recessed part 6 is airtightly sealed by bonding the lid part 4 with the seal member 5 disposed above the base part 3.

The acceleration sensor element 10 is electrically coupled to the IC 60 with bonding wires 7. Further, the IC 60 is electrically coupled to electrode pads not shown disposed in the package 2 with bonding wires 8. Thus, it is possible for a physical quantity detection circuit to output a signal detected by the acceleration sensor element 10 as an acceleration signal, and thus, it is possible for an abnormality detection circuit of the IC 60 to detect abnormality caused by breakage or the like of the acceleration sensor element 10.

The acceleration sensor element 10 is capable of detecting the acceleration in the Z direction. Such an acceleration sensor element 10 has a substrate 20, an element section 30 disposed on the substrate 20, and the lid body 50 which is bonded to the substrate 20 to cover the element section 30.

Figure 2:
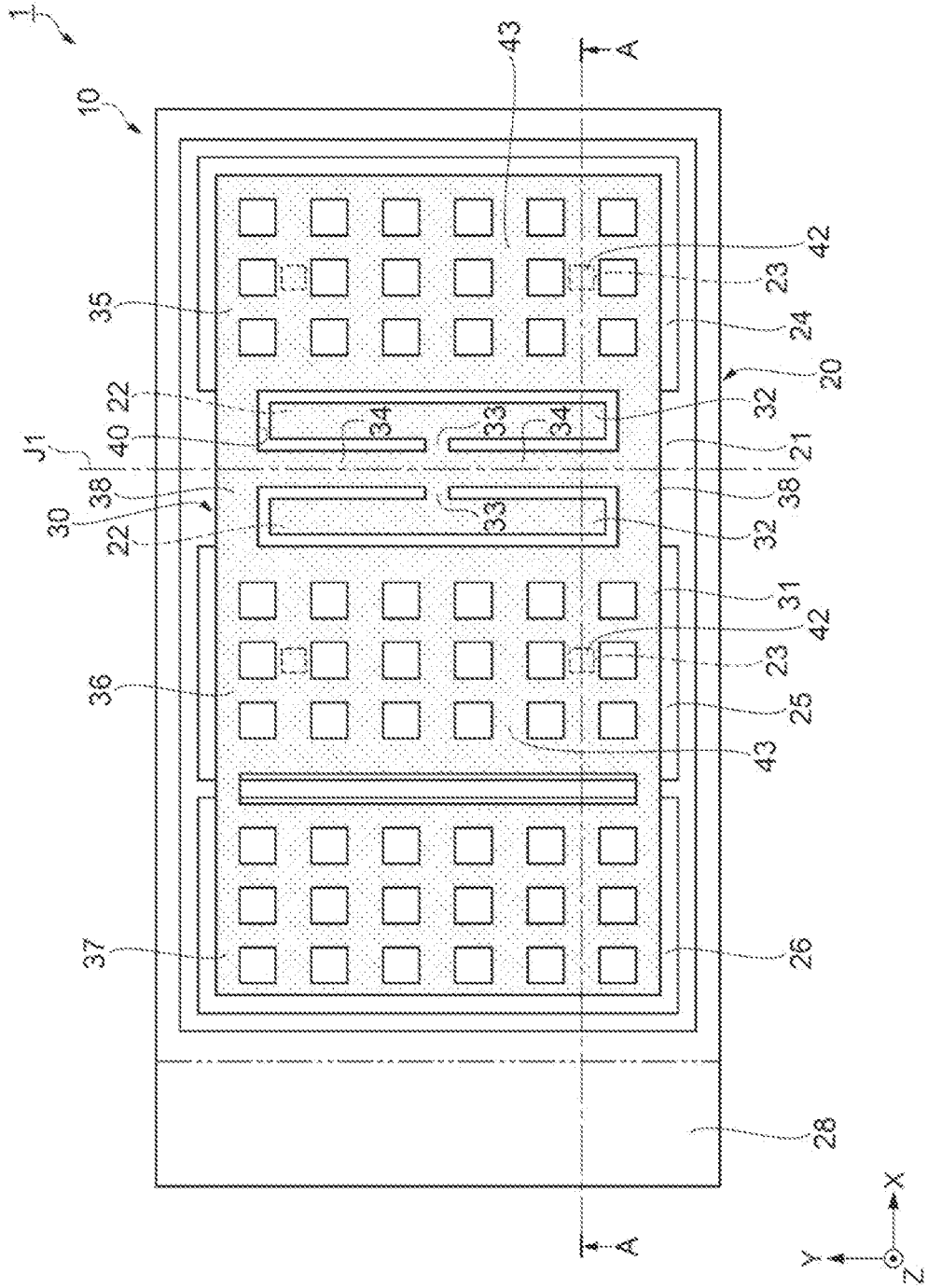
FIG. 2 is a schematic plan view showing a configuration of an acceleration sensor element.
Figure 3:
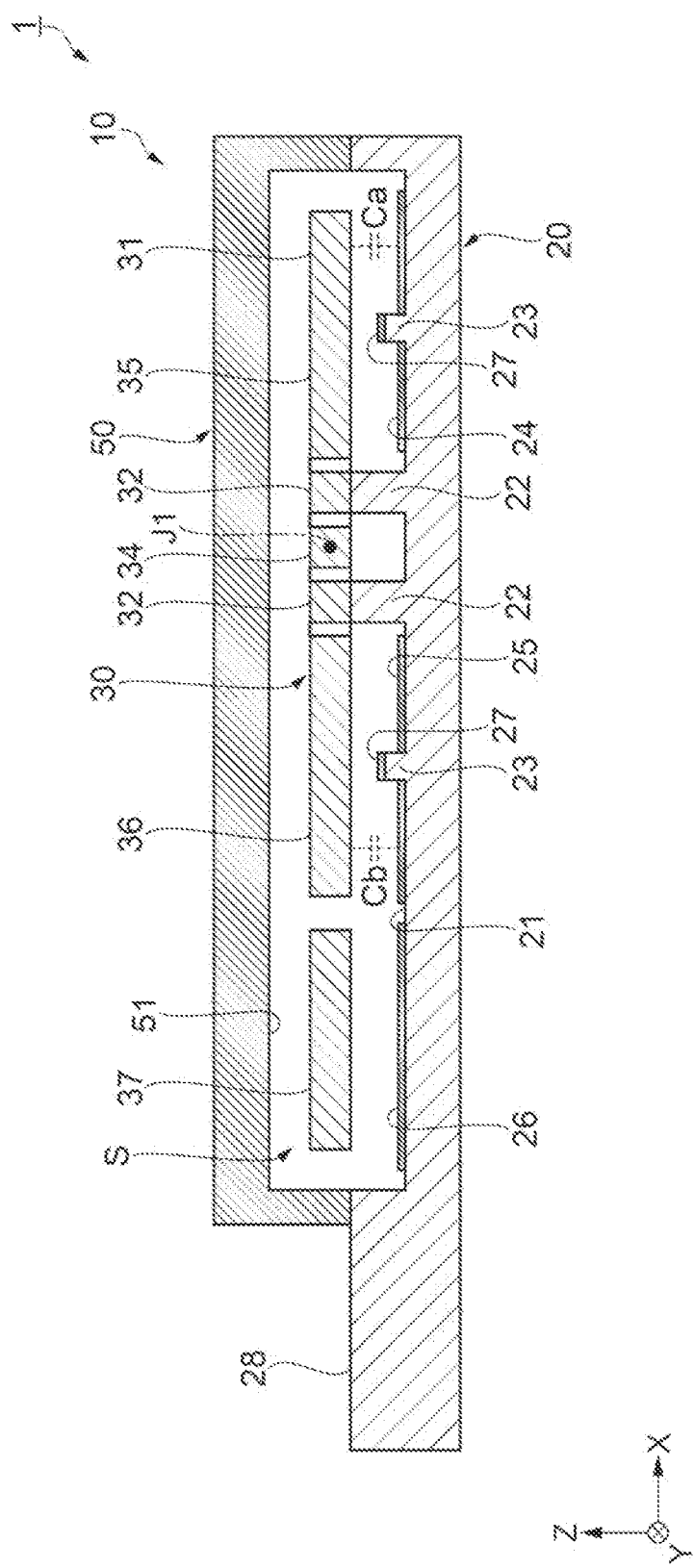
FIG. 3 is a schematic cross-sectional view along the line A-A shown in FIG. 2.

As shown in FIG. 2, the substrate 20 has spread in the X direction and the Y direction, and has a thickness in the Z direction. Further, as shown in FIG. 3, the substrate 20 is provided with a recessed part 21 opening at an upper surface side. The recessed part 21 includes the element section 30 inside, and is formed so as to be larger than the element section 30 in a plan view from the Z direction. The recessed part 21 functions as a clearance for preventing the contact between the element section 30 and the substrate 20. Further, the substrate 20 has fixation parts 22 and protrusions 23 protruding from a bottom surface of the recessed part 21 toward the element section 30, and on the bottom surface of the recessed part 21, there are disposed a first stationary electrode 24, a second stationary electrode 25, and a dummy electrode 26 overlapping the element section 30 in the plan view from the Z direction. Further, on upper surfaces of the fixation parts 22, there is bonded the element section 30. Further, the protrusions 23 are disposed at positions overlapping a first mass part 35 and a second mass part 36 of the element section 30 described later in the plan view from the Z direction.

Further, the substrate 20 is provided with terminals which are not shown in the drawings, which are disposed in a terminal placement part 28 as an upper surface at the lid body 50 side where the recessed part 21 is not formed, and which are electrically coupled respectively to the element section 30, the first stationary electrode 24, the second stationary electrode 25, the dummy electrode 26, and detection electrodes 27 described later and provided respectively to the protrusions 23.

When an excessive seesaw oscillation occurs in the movable body 31, the protrusions 23 each make contact with the movable body 31 to thereby function as a stopper for limiting an amount of the further displacement of the movable body 31 due to the seesaw oscillation. Further, on a surface of each of the protrusions 23 opposed to the element section 30, there is disposed the detection electrode 27. By providing such protrusions 23, when the excessive seesaw oscillation occurs in the movable body 31, the detection electrode 27 and the movable body 31 make contact with each other to function as a switch for detecting the fact that the protrusion 23 and the movable body 31 have made contact with each other.

As the substrate 20, it is possible to use a glass substrate formed of a glass material including alkali metal ions as movable ions such as Na+ such as borosilicate glass such as Pyrex (registered trademark) glass or Tempax (registered trademark) glass. It should be noted that the substrate 20 is not particularly limited, but it is also possible to use, for example, a silicon substrate or a ceramic substrate.

As shown in FIG. 3, the lid body 50 is provided with a recessed part 51 opening at a lower surface side. The lid body 50 is bonded to the upper surface of the substrate 20 with the element section 30 housed in the recessed part 51. Further, the lid body 50 and the substrate 20 form a housing space S for housing the element section 30 inside. It is preferable for the housing space S to be a gastight space filled with an inert gas such as nitrogen, helium, or argon, and provided with substantially atmospheric pressure at the operating temperature in a range of about −40° C. through 125° C. It should be noted that the atmosphere in the housing space S is not particularly limited, but can be, for example, in a reduced-pressure state, or can also be in a pressurized state.

As the lid body 50, there can be used, for example, a silicon substrate. It should be noted that material of the lid body 50 is not particularly limited, but it is also possible to use, for example, a glass substrate or a ceramic substrate. Further, the bonding method between the substrate 20 and the lid body 50 is not particularly limited, but can arbitrarily be selected in accordance with the materials of the substrate 20 and the lid body 50, and there can be used, for example, anodic bonding, activation bonding for bonding the bonding surfaces activated by irradiation with plasma, bonding with a bonding material such as glass frit, and diffusion bonding for bonding metal films deposited on the upper surface of the substrate 20 and the lower surface of the lid body 50 to each other.

The element section 30 can be formed by patterning a silicon substrate doped with impurities such as phosphorus (P), boron (B), or arsenic (As) to have electrical conductivity using an etching process, in particular a Bosch process as a deep reactive ion etching technology. It should be noted that the constituent material of the element section 30 is not limited to the silicon substrate, but it is also possible to use, for example, a glass substrate or a ceramic substrate. However, when using the glass substrate or a ceramic substrate as a nonconductive material, it is necessary to form electrodes on first portions 42 opposed to the protrusions 23 of the surface at the substrate 20 side and second portions 43 opposed to the first stationary electrode 24 and the second stationary electrode 25. In the present embodiment, since the element section 30 is the silicon substrate having electrical conductivity, and therefore, the first portions 42 and the second portions 43 each correspond to an electrode, there is no need to form the electrodes.

As shown in FIG. 2, the element section 30 has holding parts 32 bonded respectively to upper surfaces of the fixation parts 22, the movable body 31 which can be displaced with respect to the first stationary electrode 24 and the second stationary electrode 25, second support beams 34 which enables the movable body 31 to be displaced around a rotational axis J1 as an oscillation axis extending along the Y axis with respect to the holding parts 32, and first support beams 33 which couple the second support beams 34 and the holding parts 32 to each other. The fixation parts 22 and the holding parts 32 are, for example, anodically bonded to each other, and the first support beams 33 and the second support beams 34 couple the movable body 31 and the fixation parts 22 to each other via the holding parts 32 as a result.

The movable body 31 has an oblong shape having a longitudinal direction aligned with the X direction in the plan view from the Z direction. Further, the movable body 31 has the first mass part 35 and the second mass part 36 disposed across the rotational axis J1 along the Y axis from each other in the plan view from the Z direction, and a third mass part 37 coupled to the second mass part 36. The first mass part 35 is located at the positive X direction side of the rotational axis J1, and the second mass part 36 and the third mass part 37 are located at the negative X direction side of the rotational axis J1. Further, the second mass part 36 and the third mass part 37 located at the negative X direction side of the rotational axis J1 is longer in length in the X direction than the first mass part 35, and is higher in rotational moment around the rotational axis J1 caused when the acceleration in the Z direction is applied than the first mass part 35 located at the positive X direction side of the rotational axis J1.

Due to the difference in rotational moment, the movable body 31 makes the seesaw oscillation around the rotational axis J1 when the acceleration in the Z direction is applied. It should be noted that the seesaw oscillation means that the second mass part 36 is displaced toward the negative Z direction when the first mass part 35 is displaced toward the positive Z direction, and on the contrary, when the first mass part 35 is displaced toward the negative Z direction, the second mass part 36 is displaced toward the positive Z direction.

Further, in the movable body 31, the first mass part 35 and the second mass part 36 are coupled to each other with coupling parts 38, and there is provided an opening part 40 located between the first mass part 35 and the second mass part 36. Further, the holding parts 32, the first support beams 33, and the second support beams 34 are disposed in the opening part 40. By disposing the holding parts 32, the first support beams 33, and the second support beams 34 inside the movable body 31 as described above, it is possible to achieve reduction in size of the element section 30. Further, the movable body 31 has a plurality of through holes evenly formed in the entire area thereof. Thus, it is possible to reduce dumping due to viscosity. It should be noted that the through holes can be omitted, and are not required to be arranged evenly.

Further, in the movable body 31, the coupling parts 38 and the holding parts 32 arranged in the Y direction are coupled to each other via the first support beams 33 and the second support beams 34 extending in the Y direction. Therefore, it is possible to displace the movable body 31 around the rotational axis J1 with the seesaw oscillation using the second support beams 34 as the rotational axis J1.

Then, the first stationary electrode 24, the second stationary electrode 25, and the dummy electrode 26 disposed on the bottom surface of the recessed part 21 will be described.

As shown in FIG. 2 and FIG. 3, in the plan view from the Z direction, the first stationary electrode 24 is disposed so as to overlap the first mass part 35, and the second stationary electrode 25 is disposed so as to overlap the second mass part 36. The first stationary electrode 24 and the second stationary electrode 25 are disposed substantially symmetrically about the rotational axis J1 in the plan view from the Z direction so that the capacitances Ca, Cb described later become equal to each other in a natural state in which no acceleration in the Z axis is applied.

Further, the dummy electrode 26 is located at the negative X direction side of the second stationary electrode 25, and is disposed so as to overlap the third mass part 37. By covering the bottom surface of the recessed part 21 with the dummy electrode 26 as described above, it is possible to prevent the bottom surface of the recessed part 21 from being electrostatically charged due to the migration of the alkali metal ions in the substrate 20. Therefore, it is possible to effectively prevent an unwanted electrostatic attractive force which causes an erroneous operation of the movable body 31 from occurring between the bottom surface of the recessed part 21 and the second mass part 36. Therefore, there is obtained the acceleration sensor element 10 capable of more accurately detecting the acceleration in the Z direction.

Although not shown in the drawings, when driving the acceleration sensor element 10, a drive voltage is applied to the element section 30 via interconnections not shown, the first stationary electrode 24 and a QV amplifier are coupled to each other with an interconnection not shown, and the second stationary electrode 25 and another QV amplifier are coupled to each other with an interconnection not shown. Thus, the capacitance Ca is formed between the first mass part 35 and the first stationary electrode 24, and the capacitance Cb is formed between the second mass part 36 and the second stationary electrode 25. The capacitances Ca, Cb are substantially equal to each other in the natural state in which no acceleration in the Z direction is applied.

When the acceleration in the Z direction is applied to the acceleration sensor element 10, the movable body 31 makes the seesaw oscillation centering on the rotational axis J1. Due to the seesaw oscillation of the movable body 31, a gap between the first mass part 35 and the first stationary electrode 24 varies in reversed phase with a gap between the second mass part 36 and the second stationary electrode 25, and accordingly, the capacitances Ca, Cb vary in reversed phase with each other. Therefore, it is possible for the acceleration sensor element 10 to detect the acceleration in the Z direction based on the variations of the capacitances Ca, Cb.

Then, a configuration and an operation of the IC 60 will be described.

The IC 60 has a physical quantity detection circuit for detecting the acceleration and so on, and an abnormality detection circuit for detecting the abnormality due to the contact between the movable body 31 and the protrusions 23.

Figure 4:
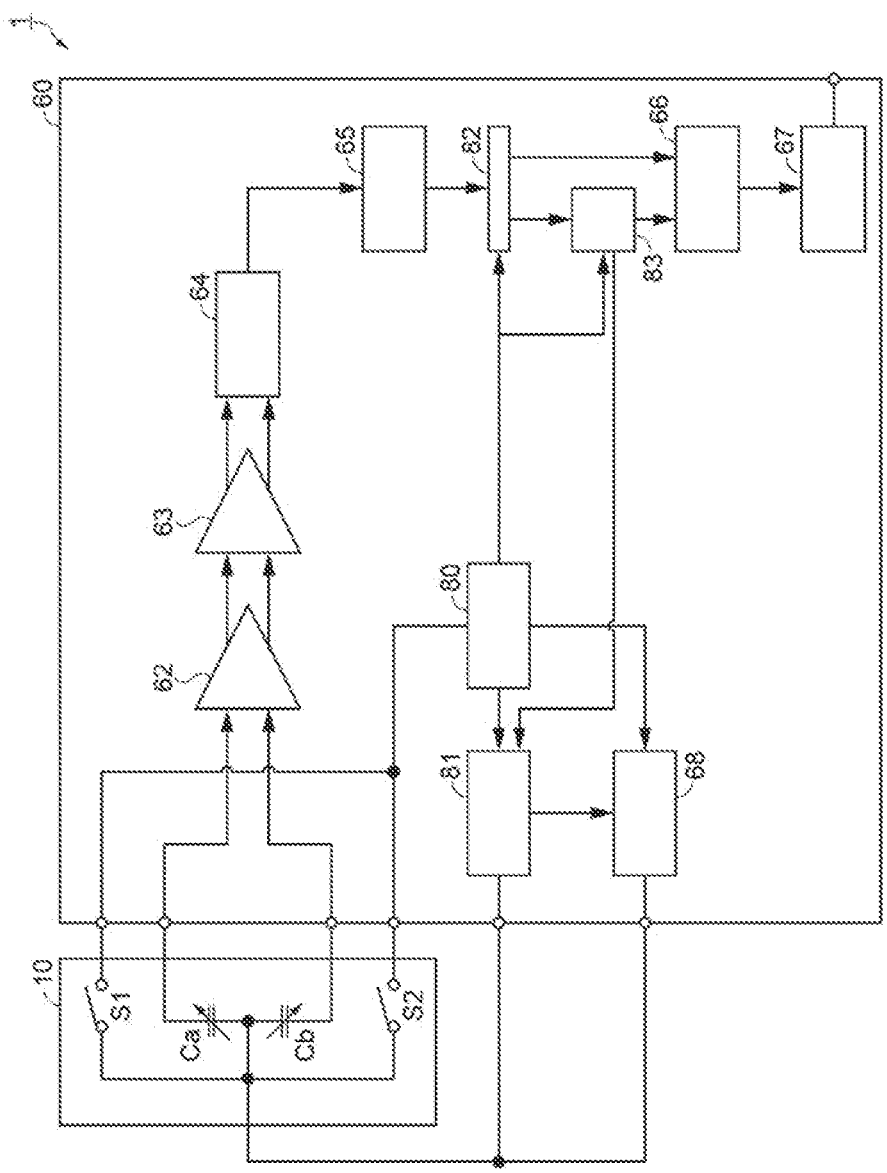
FIG. 4 is a block diagram showing a schematic configuration of the inertial sensor.

As shown in FIG. 4, the physical quantity detection circuit of the IC 60 is configured including a Q/V amplifier (QVA) 62, a programmable-gain amplifier (PGA) 63, an A/D conversion circuit (ADC) 64, a digital filter 65, a storage section 66, an interface circuit 67, and a drive circuit 68.

Figure 5:
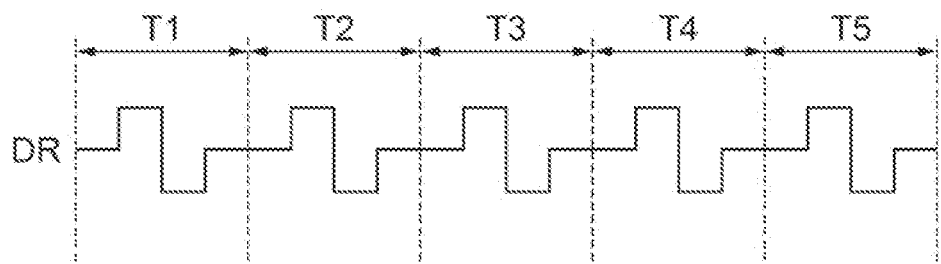
FIG. 5 is a diagram showing a waveform of a drive signal.

The drive circuit 68 applies a drive signal shown in FIG. 5 to the element section 30 of the acceleration sensor element 10 based on a clock signal. Subsequently, the detection signal detected by the acceleration sensor element 10 is input to the Q/V amplifier 62 via a terminal.

The Q/V amplifier 62 converts a differential signal pair of a charge output from the acceleration sensor element 10 into a differential signal pair of the voltage, and then outputs the differential signal pair of the voltage.

The differential signal pair output from the Q/V amplifier 62, in other words a differential voltage signal, is input to the programmable-gain amplifier 63, and the programmable-gain amplifier 63 outputs a differential signal pair obtained by amplifying the differential signal thus input.

The A/D conversion circuit 64 converts an analog signal which is a voltage signal of the differential signal pair output from the programmable-gain amplifier into a digital signal.

The digital filter 65 performs a filtering process on the digital signal output from the A/D conversion circuit 64 based on the clock signal. Since the high-frequency noise generated by the A/D conversion process in the A/D conversion circuit 64 is superimposed on the digital signal output from the A/D conversion circuit 64, the digital filter 65 functions as a low-pass filter for reducing the high-frequency noise. A Z-axis acceleration signal having a digital value corresponding to the magnitude and the direction of the Z-axis acceleration is included in the digital signal output from the digital filter 65 in a time-sharing manner. Therefore, the circuit constituted by the Q/V amplifier 62, the programmable-gain amplifier 63, the A/D conversion circuit 64, and the digital filter 65 functions as an acceleration signal generation circuit which becomes a physical quantity signal generation circuit for generating an acceleration signal corresponding to the magnitude of the acceleration detected with respect to the Z axis based on the differential signal pair output from the acceleration sensor element 10 for detecting the acceleration with respect to the Z axis.

The storage section 66 has a register and a nonvolatile memory. In the nonvolatile memory, there are stored a variety of types of information such as a variety of types of data such as gain adjustment data of the programmable-gain amplifier 63, or the filter coefficient of the digital filter 65 with respect to each of the circuits included in the physical quantity detection circuit. The nonvolatile memory can be constituted as, for example, an MONOS (Metal Oxide Nitride Oxide Silicon) memory or an EEPROM (Electrically Erasable Programmable Read-Only Memory). When powering on the physical quantity detection circuit, a variety of types of data stored in the nonvolatile memory are transferred to and held by the registers, and the variety of types of data held by the registers are supplied to the respective circuits.

Further, in the register, the acceleration signal output by the digital filter 65 is stored as n-bit acceleration data.

The interface circuit 67 is a circuit for outputting the Z-axis acceleration signal corresponding to the magnitude of the acceleration detected with respect to the Z axis described above as a digital signal via a wiring pattern for serial communication, and further communicating with an external device not shown of the inertial sensor 1 via the wiring pattern for the serial communication. It is possible for the external device to write/read data to/from the storage section 66 via the interface circuit 67. The interface circuit 67 can be, for example, a three-terminal or four-terminal SPI (Serial Peripheral Interface) interface circuit, or can also be a two-terminal I²C (Inter-Integrated Circuit) interface circuit. For example, it is possible for the external device to read out the acceleration data and flag information stored in the registers of the storage section 66 to perform a variety of types of processing using the acceleration data.

Further, as shown in FIG. 4, the abnormality detection circuit of the IC 60 is configured including a contact detection circuit 80, a self-diagnostic circuit 81, a test mode changing-over switch 82, and a determination circuit 83.

The switches S1, S2 are each formed of the movable body 31 of the acceleration sensor element 10 and the detection electrode 27 provided to the protrusion 23, and each turn on when the movable body 31 and the detection electrode 27 make contact with each other. When the contact detection circuit 80 has detected the drive signal which is conducted when the switch S1 or the switch S2 turns on, the contact detection circuit 80 outputs a detection signal.

It should be noted that when the drive circuit 68 has received the detection signal from the contact detection circuit 80, the drive circuit 68 stops outputting the drive signal.

Figure 6:
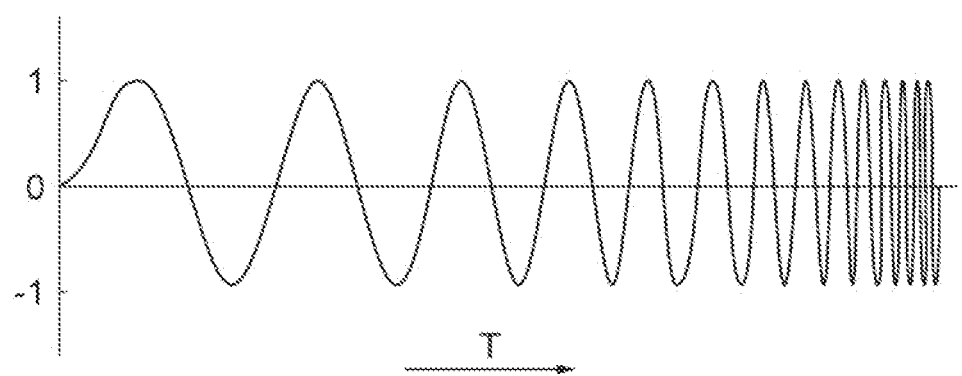
FIG. 6 is a diagram showing a waveform of a test signal.

When the self-diagnostic circuit 81 receives the detection signal from the contact detection circuit 80, the self-diagnostic circuit 81 outputs a test signal to the element section 30 of the acceleration sensor element 10. It should be noted that the test signal is a so-called chirp signal shown in FIG. 6 consisting of a plurality of frequencies in order to deal with the drive frequency and the resonance frequency in case the movable body is damaged.

Further, the self-diagnostic circuit 81 can correctly determine the damage or the like of the movable body 31 by deferring the output of the test signal for a predetermined period such as 1 through 2 seconds after the contact detection circuit 80 has detected the drive signal.

When the test mode changing-over switch 82 has received the detection signal from the contact detection circuit 80, the signal which has been output from the element section 30 in response to the application of the test signal is input to the determination circuit 83 by the test mode changing-over switch 82. It should be noted that when the test mode changing-over switch 82 fails to receive the detection signal from the contact detection circuit 80, namely when the movable body 31 and the detection electrode 27 fail to make contact with each other, the test mode changing-over switch 82 determines that the normal drive is performed, and stores the acceleration signal output from the digital filter 65 in the storage section 66.

Figure 7:
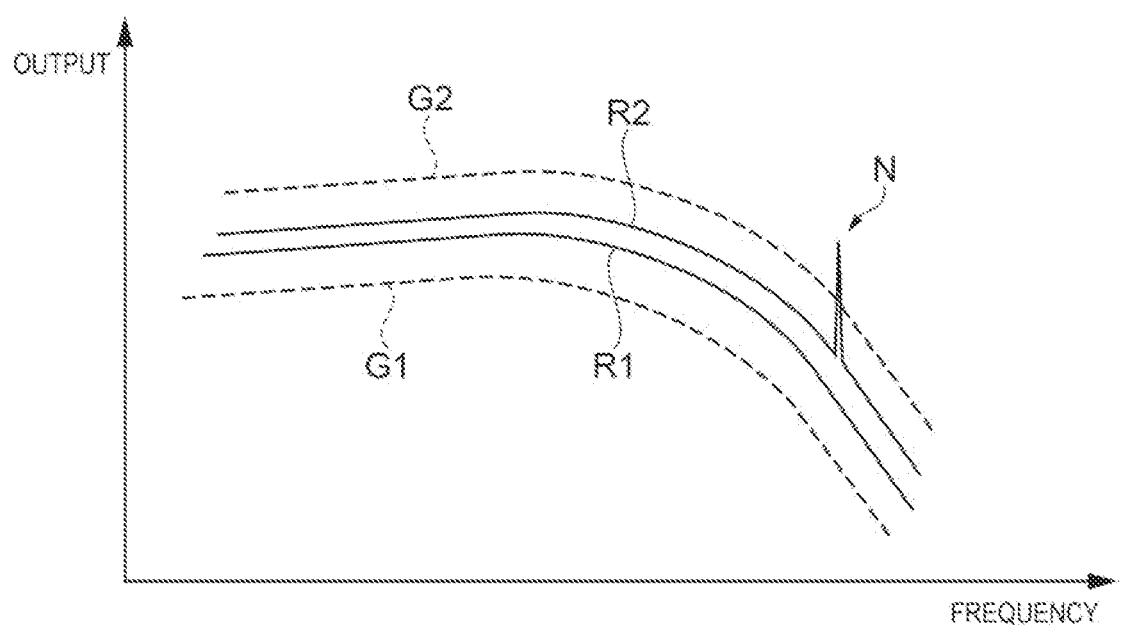
FIG. 7 is a diagram showing output levels in normal drive and abnormal drive.

The determination circuit 83 determines whether or not a level of the signal output by the element section 30 in response to the test signal is out of a threshold value. Specifically, the signal output from the digital filter 65 in response to the application of the test signal is time-series data, and is therefore converted in the determination circuit 83 into a frequency using the fast Fourier transformation, and then the frequency thus converted is compared with a lower limit value G1 and an upper limit value G2 of a threshold value of an output characteristic stored in the storage section 66. As shown in FIG. 7, the output level R1 in normal drive falls within a range between the lower limit value G1 and the upper limit value G2 of the threshold value represented by the dotted lines, but the output level R2 in abnormal drive with the movable body 31 damaged exceeds the upper limit value G2 of the threshold value due to a noise N generated in accordance with the damage of the movable body 31. Therefore, the output level R2 is determined as abnormal, and is stored in the register of the storage section 66 as an abnormality detection flag.

Further, when the determination circuit 83 has determined that the output level is normal, the determination circuit 83 outputs a test signal stop signal to the self-diagnostic circuit 81 to stop outputting the test signal. The self-diagnostic circuit 81 which has received the test signal stop signal from the determination circuit 83 outputs a start signal to the drive circuit 68 to make the drive circuit 68 output the drive signal.

Further, when the level of the signal output by the element section 30 in response to the test signal comes out of the range between the lower limit value G1 and the upper limit value G2 of the threshold value, the interface circuit 67 outputs a caution signal.

As described hereinabove, the inertial sensor 1 according to the present embodiment is equipped with the acceleration sensor element 10 including the substrate 20, the stationary electrodes 24, 25 provided to the substrate 20, the element section 30 including the movable body 31 which can be replaced with respect to the stationary electrodes 24, 25 and has the electrodes in the first portions 42 and the second portions 43 opposed to the stationary electrodes 24, 25, and the protrusions 23 which limit the amount of the displacement of the movable body 31, and which have the detection electrodes 27 in the portions opposed to the first portions 42 of the movable body 31. Further, the inertial sensor 1 is provided with the IC 60 having the drive circuit 68 for outputting the drive signal to the element section 30 and the abnormality detection circuit including the contact detection circuit 80 which outputs the detection signal in response to the contact between the electrodes of the first portions 42 of the movable body 31 and the detection electrodes 27 of the protrusions 23, the self-diagnostic circuit 81 which outputs the test signal to the element section 30 when receiving the detection signal from the contact detection circuit 80, and the determination circuit 83 for determining whether or not the level of the signal output by the element section 30 in response to the test signal is out of the threshold value. Therefore, the movable body 31 having electrical conductivity of the acceleration sensor element 10 and the detection electrodes 27 provided to the protrusions 23 function as the switches, and it is possible for the abnormality detection circuit of the IC 60 to detect the fact that the movable body 31 and the protrusions 23 are in the contact state. Further, since there is provided the abnormality detection circuit, it is possible to detect the abnormality due to the fact that the movable body 31 is in the state in which damage occurs when the movable body 31 and the protrusions 23 make contact with each other. Therefore, it is possible to obtain the inertial sensor 1 having a mechanism for detecting that the movable body 31 is damaged.

2. Second Embodiment

Then, an inertial sensor 1*a* according to a second embodiment will be described with reference to FIG. 8.

Compared to the inertial sensor 1 according to the first embodiment, the inertial sensor 1*a* according to the present embodiment is substantially the same as the inertial sensor 1 according to the first embodiment except the point that a structure of an acceleration sensor element 10*a* is different. It should be noted that the description will be presented with a focus on the difference from the first embodiment described above, and the description of substantially the same issues will be omitted.

Figure 8:
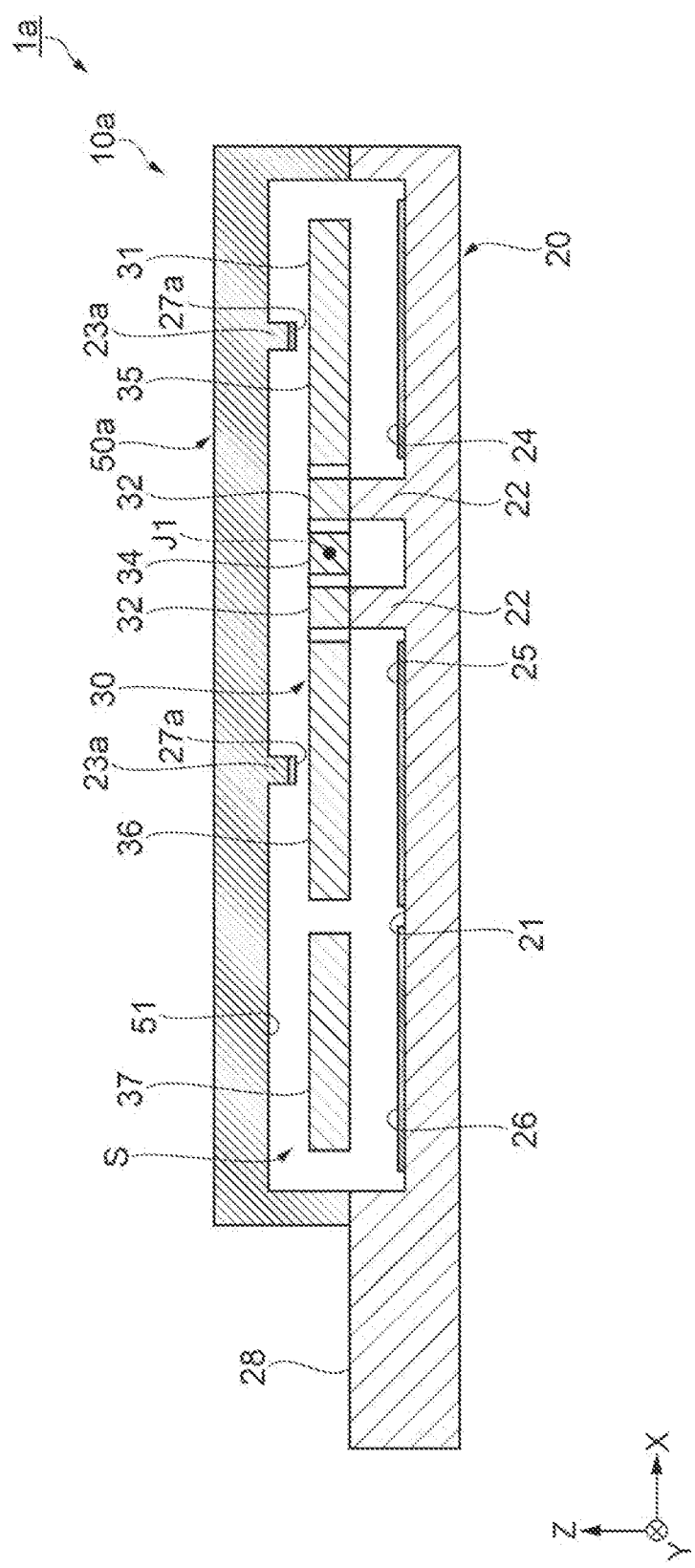
FIG. 8 is a schematic cross-sectional view showing a configuration of an inertial sensor according to a second embodiment.

As shown in FIG. 8, in the inertial sensor 1*a*, protrusions 23*a* protruding toward the movable body 31 are provided to the recessed part 51 of a lid body 50*a* of the acceleration sensor element 10*a*. The protrusions 23*a* are disposed at positions which are opposed to the first mass part 35 or the second mass part 36, and which overlap the first mass part 35 or the second mass part 36 in the plan view from the Z direction. Further, on a surface of each of the protrusions 23*a* opposed to the element section 31, there is disposed a detection electrode 27*a*.

By adopting such a configuration, the movable body formed of an electrically-conductive material and the detection electrodes 27*a* respectively provided to the protrusions 23*a* function as the switches for detecting the fact that the protrusions 23*a* and the movable body 31 have made contact with each other, and thus, it is possible to obtain the inertial sensor 1*a* having substantially the same advantages as those of the first embodiment.

3. Third Embodiment

Then, an inertial sensor 1*b* according to a third embodiment will be described with reference to FIG. 9 and FIG. 10. It should be noted that in FIG. 9, the illustration of the lid body 50 and an element section 30*b* is omitted for the sake of convenience of explanation.

Compared to the inertial sensor 1 according to the first embodiment, the inertial sensor 1*b* according to the present embodiment is substantially the same as the inertial sensor 1 according to the first embodiment except the point that a structure of an acceleration sensor element 10*b* is different. It should be noted that the description will be presented with a focus on the difference from the first embodiment described above, and the description of substantially the same issues will be omitted.

Figure 9:
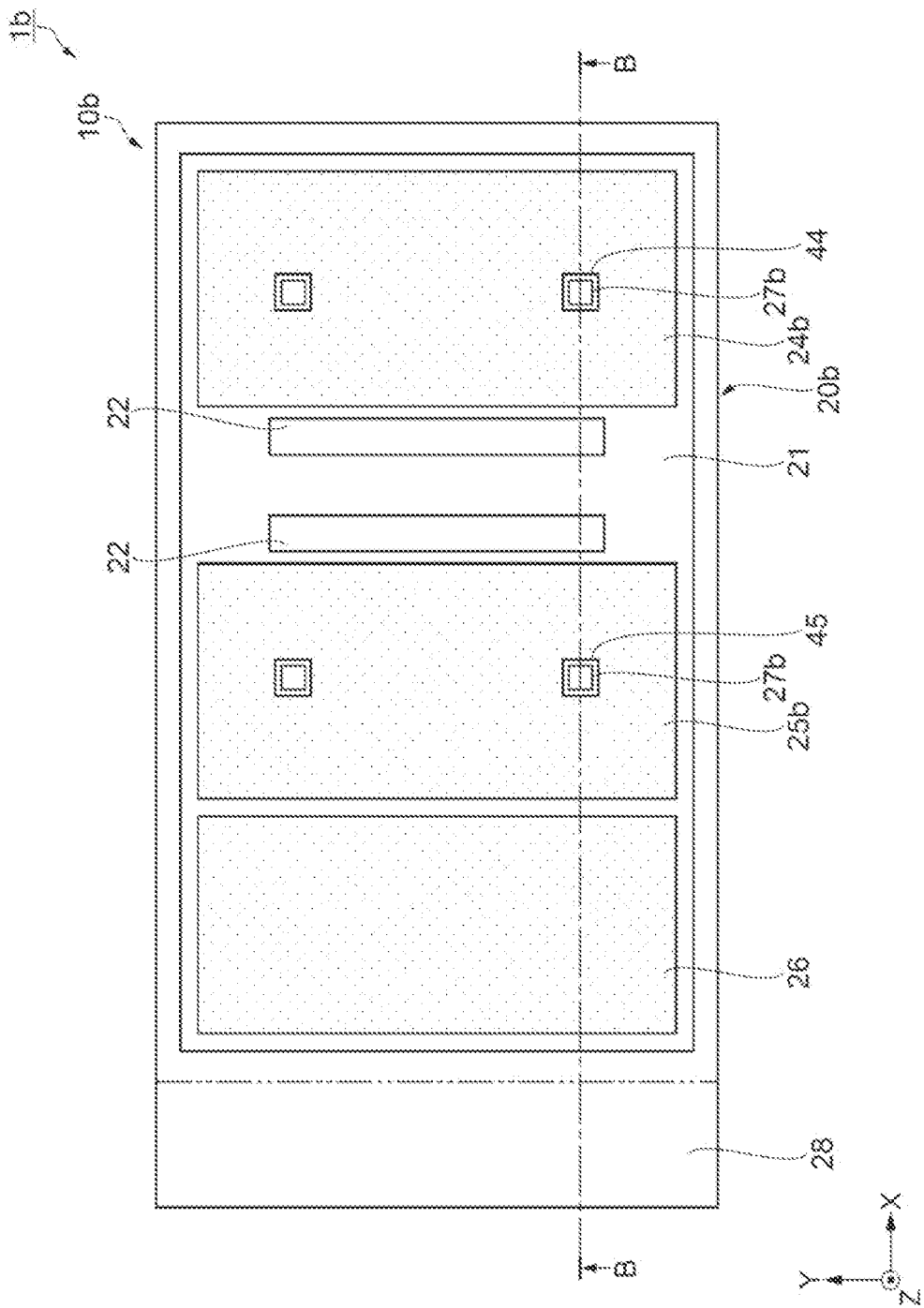
FIG. 9 is a schematic plan view showing a configuration of an inertial sensor according to a third embodiment.
Figure 10:
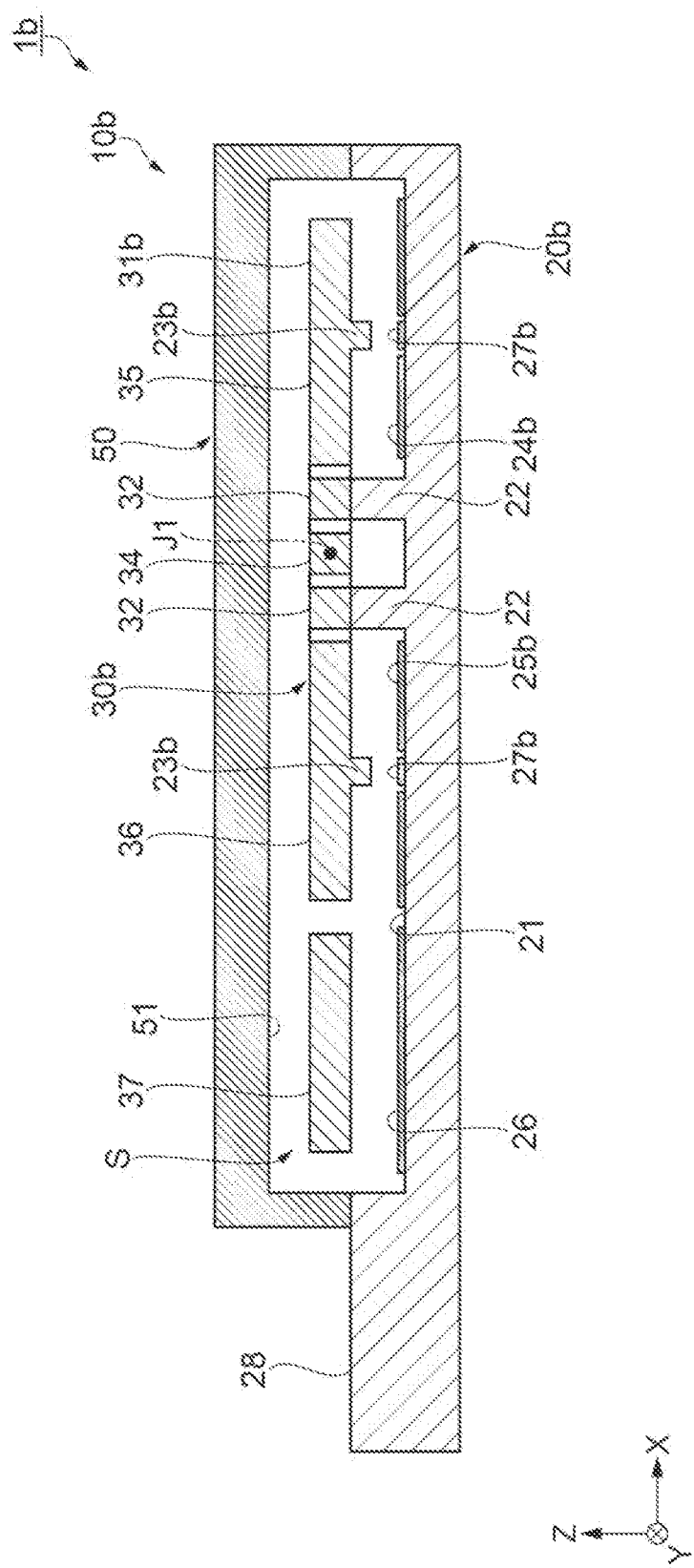
FIG. 10 is a schematic cross-sectional view along the line B-B shown in FIG. 9.

As shown in FIG. 9 and FIG. 10, in the inertial sensor 1*b*, protrusions 23*b* protruding toward a substrate 20*b* are disposed on a surface of the element section 30*b* located at a movable body 31*b* side. The protrusions 23*b* are provided to the first mass part 35 and the second mass part 36, and are disposed at positions respectively overlapping detection electrodes 27*b* disposed on the bottom surface of the recessed part 21 of the substrate 20*b*, and in respective opening parts 44, 45 of a first stationary electrode 24*b* and a second stationary electrode 25*b* in the plan view from the Z direction.

By adopting such a configuration, the movable body 31*b* formed of an electrically-conductive material and the detection electrodes 27*b* provided to the substrate 20*b* function as the switches for detecting the fact that the protrusions 23*b* of the movable body 31*b* and the substrate 20*b* have made contact with each other, and thus, it is possible to obtain the inertial sensor 1*b* having substantially the same advantages as those of the first embodiment.

4. Fourth Embodiment

Then, an inertial sensor 1*c* according to a fourth embodiment will be described with reference to FIG. 11 and FIG. 12. It should be noted that in FIG. 11, the illustration of a lid body 50*c* is omitted for the sake of convenience of explanation.

Compared to the inertial sensor 1 according to the first embodiment, the inertial sensor 1c according to the present embodiment is substantially the same as the inertial sensor 1 according to the first embodiment except the point that a structure of an acceleration sensor element 10c is different. It should be noted that the description will be presented with a focus on the difference from the first embodiment described above, and the description of substantially the same issues will be omitted.

Figure 11:
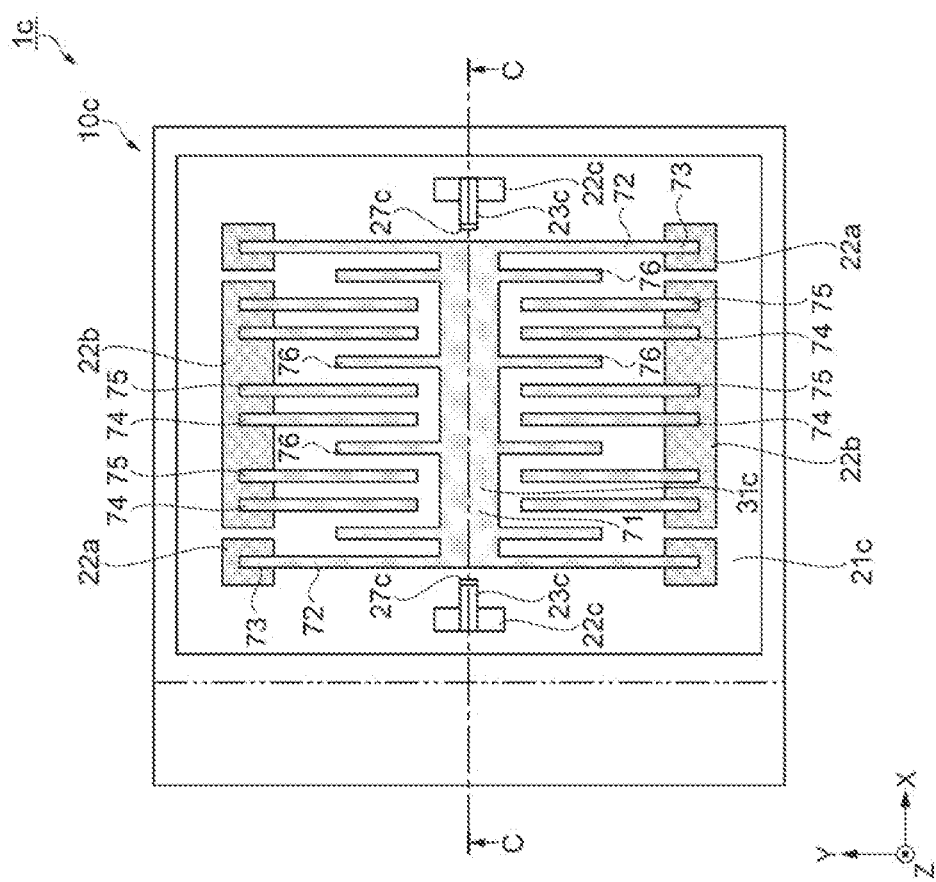
FIG. 11 is a schematic plan view showing a configuration of an inertial sensor according to a fourth embodiment.
Figure 12:
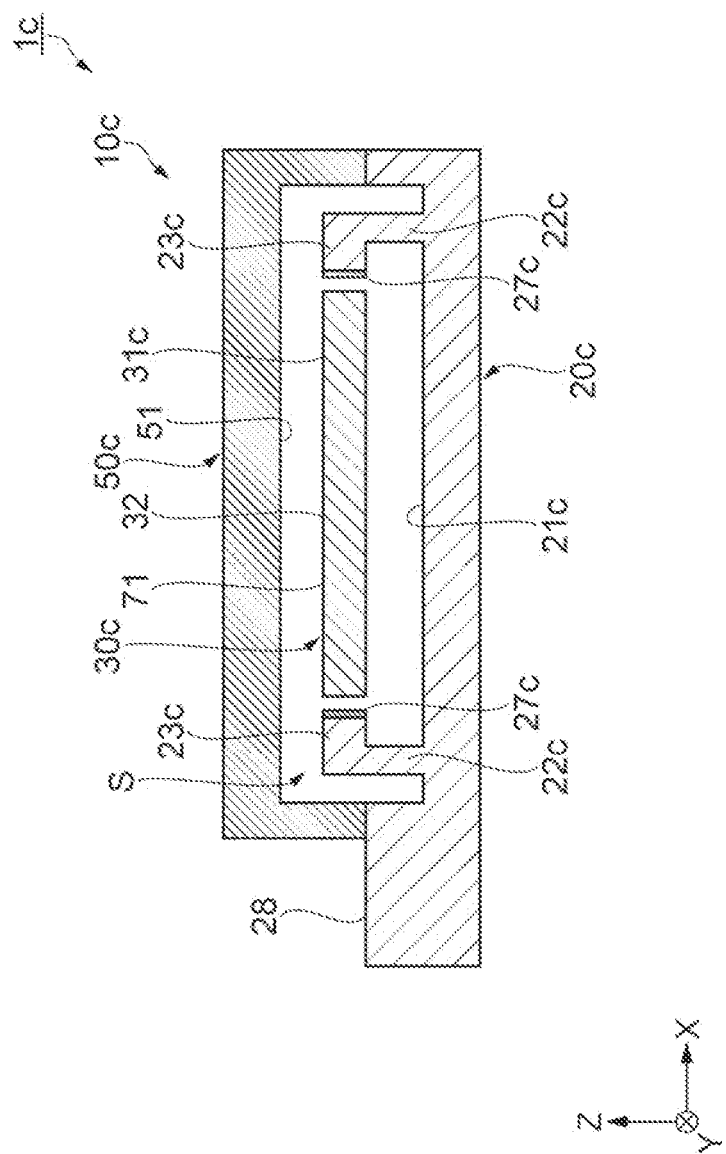
FIG. 12 is a schematic cross-sectional view along the line C-C shown in FIG. 11.

The acceleration sensor element 10c shown in FIG. 11 and FIG. 12 is a sensor element for detecting the acceleration in the X direction. The acceleration sensor element 10c has a substrate 20c, an element section 30c disposed on the substrate 20c, and the lid body 50c which is bonded to the substrate 20c to cover the element section 30c.

As shown in FIG. 11, the substrate 20c has spread in the X direction and the Y direction, and has a thickness in the Z direction. Further, as shown in FIG. 12, the substrate 20c is provided with a recessed part 21c opening at an upper surface side. The recessed part 21c includes the element section 30c inside, and is formed so as to be larger than the element section 30c in a plan view from the Z direction. The recessed part 21c functions as a clearance for preventing the contact between the element section 30c and the substrate 20c. Further, the substrate 20c has a plurality of mount parts 22a, 22b, and 22c protruding from a bottom surface of the recessed part 21c toward the element section 30c. The mount parts 22a, 22b are respectively disposed at the positive side and the negative side in the Y direction on the bottom surface of the recessed part 21c in the plan view from the Z direction. The mount parts 22c are respectively disposed at the positive side and the negative side in the X direction on the bottom surface of the recessed part 21c in the plan view from the Z direction. Further, to a surface of each of the mount parts 22c located at the lid body 50c side, there is fixed a protrusion 23c extending in the X direction. The protrusion 23c overlaps the movable body 31c of the element section 30c in a cross-sectional view from the X direction, and protrudes toward the movable body 31c. It should be noted that although the protrusions 23c are fixed to the substrate 20c in the present embodiment, this is not a limitation, and it is possible to fix the protrusions 23c to the lid body 50c.

The protrusions 23c each function as a stopper which makes contact with the movable body 31c when excessive acceleration in the X direction is applied to the movable body 31c of the element section 30c to thereby limit the further displacement in the X direction of the movable body 31c due to the acceleration. Further, on a surface of each of the protrusions 23c opposed to the element section 30c, there is disposed a detection electrode 27c. By providing such protrusions 23c, when the excessive acceleration in the X direction is applied to the movable body 31c, the detection electrode 27c and the movable body 31c make contact with each other to function as a switch for detecting the fact that the protrusion 23c and the movable body 31c have made contact with each other.

As shown in FIG. 12, the lid body 50c is provided with a recessed part 51 opening at a lower surface side. The lid body 50c is bonded to the upper surface of the substrate 20c with the element section 30c housed in the recessed part 51c. Further, the lid body 50c and the substrate 20c form the housing space S for housing the element section 30c inside.

As shown in FIG. 11 and FIG. 12, the element section 30c is provided with the movable body 31c, spring parts 72, fixation parts 73, and stationary detection electrodes 74, 75.

The movable body 31c is formed of a silicon substrate having electrical conductivity, and has a base part 71 extending in the X direction, and a plurality of movable detection electrodes 76 projecting from the base part 71 toward both sides in the Y direction. Such a movable body 31c is coupled to the fixation parts 73 via the spring parts 72 in both end portions of the base part 71. Further, the fixation parts 73 are respectively fixed to the mount parts 22a protruding from the bottom surface of the recessed part 21c. Thus, it becomes possible for the movable body 31c to be displaced in the X direction with respect to the fixation parts 73. Further, the stationary detection electrodes 74, 75 are fixed to the mount parts 22b protruding from the bottom surface of the recessed part 21c, and are disposed across the movable detection electrode 76 from each other. In other words, the movable detection electrodes 76 and the stationary detection electrodes 74, 75 are arranged in a comb-like shape.

It should be noted that although not shown in the drawings, the substrate 20c is provided with an interconnection electrically coupled to the movable body 31c, an interconnection electrically coupled to the stationary detection electrodes 74, an interconnection electrically coupled to the stationary detection electrodes 75, and an interconnection electrically coupled to the detection electrodes 27c, and these interconnections extend to the terminal placement part 28 of the substrate 20c. Further, the drive signal is applied to the movable body 31c, the stationary detection electrodes 74, and the stationary detection electrodes 75 from the IC 60 via the interconnections described above, and capacitances are respectively formed between the movable detection electrodes 76 and the stationary detection electrodes 74, 75.

It is possible for such an acceleration sensor element 10c to detect the acceleration in the X direction in the following manner. When the acceleration in the X direction is applied to the acceleration sensor element 10c, the movable body 31c is displaced in the X direction while elastically deforming the spring parts 72 based on the magnitude of the acceleration. Due to the displacement of the movable body 31c, a gap between the movable detection electrode 76 and the stationary detection electrode 74 and a gap between the movable detection electrode 76 and the stationary detection electrode 75 are varied, and accordingly, the capacitances between the electrodes vary. Therefore, it is possible to detect the acceleration in the X direction based on the variations in these capacitances.

By adopting such a configuration, the movable body 31c formed of an electrically-conductive material and the detection electrodes 27c respectively provided to the protrusions 23c function as the switches for detecting the fact that the movable body 31c and the protrusions 23c have made contact with each other, and thus, it is possible to obtain the inertial sensor 1c having substantially the same advantages as those of the first embodiment.

5. Fifth Embodiment

Then, a smartphone 1200 is cited as an example of an electronic apparatus equipped with the inertial sensor 1, 1a, 1b, or 1c according to a fifth embodiment, and will be described with reference to FIG. 13. It should be noted that in the following description, the description will be presented illustrating a configuration of implementing the inertial sensor 1.

Figure 13:
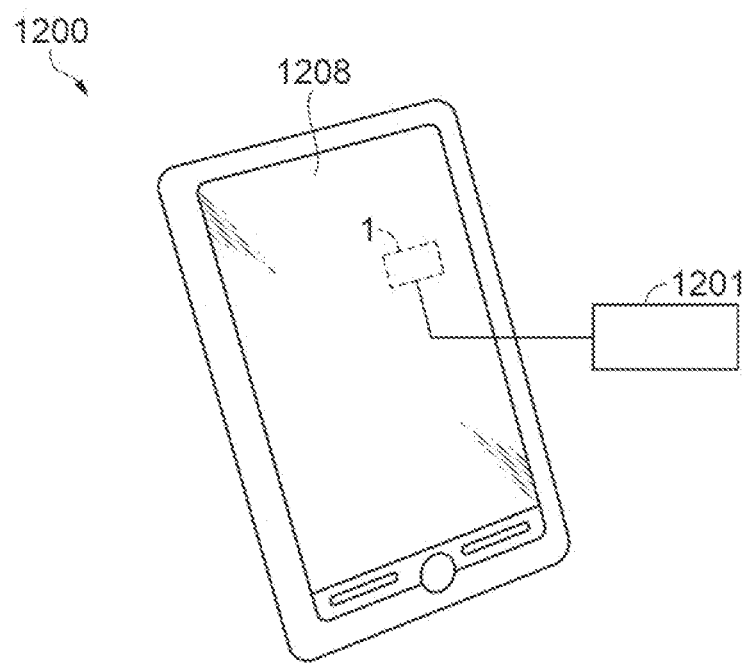
FIG. 13 is a schematic perspective view showing a configuration of a smartphone as an electronic apparatus equipped with an inertial sensor according to a fifth embodiment.

As shown in FIG. 13, the smartphone 1200 as the electronic apparatus incorporates the inertial sensor 1 described above. The detection data as a detection signal of the acceleration or the like detected by the inertial sensor 1 is transmitted to a control section 1201 of the smartphone 1200. The control section 1201 is configured including a CPU (central processing unit), and is capable of recognizing the attitude and the behavior of the smartphone 1200 from the detection data thus received, and then changing the display image currently displayed on the display section 1208, outputting an alarm or sound effects, or driving a vibration motor to vibrate the main body. In other words, it is possible to change the display content, or to generate a sound or a vibration in accordance with the posture and the behavior measured using a motion sensing function of the smartphone 1200. In particular, in the case of executing a game application, it is possible to enjoy the feeling of presence approaching the reality.

It should be noted that besides the smartphone 1200 described above, the inertial sensors 1, 1*a*, 1*b*, and 1*c* can be applied to, for example, a personal computer, a digital still camera, a tablet terminal, a timepiece, a smart watch, an inkjet printer, a laptop personal computer, a television set, a wearable terminal such as a pair of smart glasses or an HMD (head-mounted display), a video camera, a video cassette recorder, a car navigation system, a drive recorder, a pager, an electronic dictionary, an electronic translator, an electronic calculator, a computerized game machine, a toy, a word processor, a workstation, a video phone, a security video monitor, electronic binoculars, a POS terminal, medical equipment, a fish finder, a variety of measurement instruments, equipment for a mobile terminal base station, a variety of gauges for a vehicle, a railroad vehicle, an airplane, a helicopter, a ship, or a boat, a flight simulator, and a network server. In either of the cases, since these electronic apparatuses are each equipped with the inertial sensor 1, 1*a*, 1*b*, or 1*c* described above, the advantages described in the embodiments described above are reflected in the electronic apparatuses, and thus, the electronic apparatuses are excellent in performance.

6. Sixth Embodiment

Then, a car 1500 is cited as an example of a vehicle equipped with the inertial sensor 1, 1*a*, 1*b*, or 1*c* according to a sixth embodiment, and will be described with reference to FIG. 14. It should be noted that in the following description, the description will be presented illustrating a configuration of implementing the inertial sensor 1.

Figure 14:
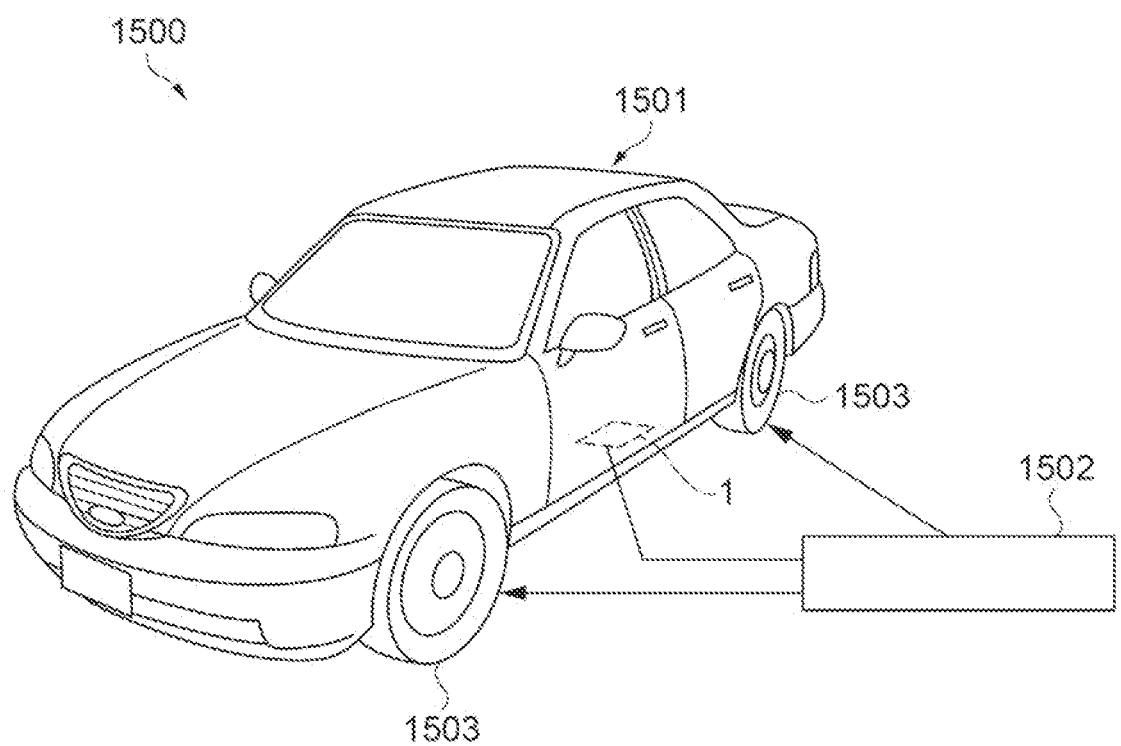
FIG. 14 is a schematic perspective view showing a configuration of a car as a vehicle equipped an inertial sensor according to a sixth embodiment.

As shown in FIG. 14, the car 1500 as the vehicle incorporates the inertial sensor 1, and is capable of detecting traveling and the attitude of the car body 1501, for example, using the inertial sensor 1. The detection signal of the inertial sensor 1 is supplied to a car-body attitude control device 1502 for controlling the traveling and the attitude of the car body 1501, and it is possible for the car-body attitude control device 1502 to detect the attitude of the car body 1501 based on the signal, and to control the stiffness of the suspension or control the brake of each of wheels 1503 in accordance with the detection result.

It should be noted that the inertial sensors 1, 1*a*, 1*b*, and 1*c* can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine control system (an engine system), a controller of an inertial navigation for an automated cruise, or a battery monitor for a hybrid car or an electric car, besides the above.

Further, besides the illustrations described above, the inertial sensors 1, 1*a*, 1*b*, and 1*c* can be used in, for example, control of movement and attitude of a two-legged robot, an electric train, and so on, remote control of a radio control airplane, a radio control helicopter, a drone, and so on, control of movement and attitude of an autonomous flight vehicle, control of movement and attitude of an agricultural machine, a construction machine and so on, and control of a rocket, an artificial satellite, a ship and a boat, an AGV (automated guided vehicle), and so on. In either of the cases, it is possible to provide a vehicle in which the advantages explained in the embodiments described above are reflected, and which is excellent in performance.

What is claimed is:

1. An inertial sensor comprising:
   a substrate;
   a stationary electrode provided to the substrate;
   an element section including a movable body which is displaceable with respect to the stationary electrode, and which has electrodes in a first portion and a second portion opposed to the stationary electrode;
   a protrusion which is configured to limit a displacement of the movable body, and which has a detection electrode in a portion opposed to the first portion of the movable body;
   a drive circuit configured to output a drive signal to the element section;
   a contact detection circuit configured to output a detection signal due to a contact between the electrode in the first portion of the movable body and the detection electrode of the protrusion;
   a self-diagnostic circuit configured to output a test signal to the element section when receiving the detection signal from the contact detection circuit; and
   a determination circuit configured to determine whether or not a level of a signal output by the element section in response to the test signal is out of a threshold value.

2. The inertial sensor according to claim 1, wherein the contact detection circuit detects the drive signal conducted by a contact between the movable body and the protrusion.

3. The inertial sensor according to claim 2, wherein the drive circuit stop outputting the drive signal when the contact detection circuit detects the drive signal.

4. The inertial sensor according to claim 2, wherein the self-diagnostic circuit defers output of the test signal for a predetermined period from when the contact detection circuit detects the drive signal.

5. The inertial sensor according to claim 1, wherein the test signal includes a plurality of frequencies.

6. The inertial sensor according to claim 5, wherein the test signal is a chirp signal.

7. The inertial sensor according to claim 1, further comprising:
   an interface circuit, wherein
   the interface circuit outputs a caution signal when a level of the signal output by the element section in response to the test signal is out of the threshold value.

8. The inertial sensor according to claim 1, further comprising:
   a lid body, wherein
   defining an X axis, a Y axis, and a Z axis perpendicular to each other as coordinate axes,
   the movable body oscillates around an oscillation axis along the Y axis, and
   the protrusion overlaps the movable body in a plan view from a direction along the Z axis, and is disposed so as to protrude from one of the substrate and the lid body toward the movable body.

9. The inertial sensor according to claim 1, wherein defining an X axis, a Y axis, and a Z axis perpendicular to each other as coordinate axes, the movable body is displaced in a direction along the X axis, and the protrusion overlaps the movable body in a cross-sectional view from a direction along the X axis, and is fixed to the substrate, and is disposed so as to protrude toward the movable body.

10. An inertial sensor comprising:

a substrate;

a stationary electrode provided to the substrate;

a detection electrode provided to the substrate;

an element section including a movable body which is displaceable with respect to the stationary electrode, and which has an electrode in a portion opposed to the stationary electrode, and a protrusion which is configured to limit a displacement of the movable body, and which has a portion of the electrode opposed to the detection electrode;

a drive circuit configured to output a drive signal to the element section;

a contact detection circuit configured to output a detection signal due to a contact between the electrode of the protrusion and the stationary electrode;

a self-diagnostic circuit configured to output a test signal to the element section when receiving the detection signal from the contact detection circuit; and a determination circuit configured to determine whether or not a level of a signal output by the element section in response to the test signal is out of a threshold value.

11. An electronic apparatus comprising:

the inertial sensor according to claim 1.

12. A vehicle comprising:

the inertial sensor according to claim 1.

* * * * *